US009049801B2

(12) United States Patent
Rothkopf et al.

(10) Patent No.: US 9,049,801 B2
(45) Date of Patent: Jun. 2, 2015

(54) INTERNAL FRAME OPTIMIZED FOR STIFFNESS AND HEAT TRANSFER

(71) Applicant: Apple Inc., Cupertino, CA (US)

(72) Inventors: Fletcher R. Rothkopf, Los Altos, CA (US); Phillip M. Hobson, Menlo Park, CA (US); Adam Mittleman, San Francisco, CA (US); Anna-Katrina Shedletsky, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 225 days.

(21) Appl. No.: 13/756,349

(22) Filed: Jan. 31, 2013

(65) Prior Publication Data

US 2013/0141870 A1 Jun. 6, 2013

Related U.S. Application Data

(63) Continuation of application No. 12/859,702, filed on Aug. 19, 2010, now Pat. No. 8,391,010.

(51) Int. Cl.
*H05K 7/20* (2006.01)
*G06F 1/16* (2006.01)
(Continued)

(52) U.S. Cl.
CPC .......... *H05K 7/20509* (2013.01); *G06F 1/1626* (2013.01); *G06F 1/1658* (2013.01); *G06F 1/203* (2013.01); *H04M 1/026* (2013.01); *H04M 1/185* (2013.01); *H05K 7/20445* (2013.01); *Y10T 29/49002* (2015.01); *H04M 1/0266* (2013.01); *H04M 1/0274* (2013.01)

(58) Field of Classification Search
CPC .......... H05K 7/20445; H05K 7/20509; H05K 1/206; H05K 1/2007; H05K 3/429; H05K 7/205
See application file for complete search history.

(56) References Cited

U.S. PATENT DOCUMENTS 4,074,419 A 2/1978 Hanni et al.
5,045,971 A 9/1991 Ono et al.
(Continued)

FOREIGN PATENT DOCUMENTS

CN 1361970 7/2002
CN 2757332 2/2006
(Continued)

OTHER PUBLICATIONS

Chinese Application for Invention No. 201110239107.8—First Office Action dated Dec. 31, 2013.
(Continued)

*Primary Examiner* — Gregory Thompson
(74) *Attorney, Agent, or Firm* — Downey Brand LLP

(57) ABSTRACT

A thin portable electronic device with a display is described. The components of the electronic device can be arranged in stacked layers within an external housing where each of the stacked layers is located at a different height relative to the thickness of the device. One of the stacked layers can be internal metal frame. The internal metal frame can be configured to act as a heat spreader for heat generating components located in layers adjacent to the internal frame. Further, the internal metal frame can be configured to add to the overall structural stiffness of the device. In addition, the internal metal frame can be configured to provide attachment points for device components, such as the display, so that the device components can be coupled to the external housing via the internal metal frame.

20 Claims, 7 Drawing Sheets

(51) Int. Cl.
  *G06F 1/20* (2006.01)
  *H04M 1/02* (2006.01)
  *H04M 1/18* (2006.01)

(56) References Cited

U.S. PATENT DOCUMENTS

| | | | |
|---|---|---|---|
| 5,128,829 A | 7/1992 | Loew | |
| 5,180,644 A | 1/1993 | Bresin et al. | |
| 5,418,685 A | 5/1995 | Hussmann et al. | |
| 5,468,947 A | 11/1995 | Danielson et al. | |
| 5,568,358 A | 10/1996 | Nelson et al. | |
| 5,737,183 A | 4/1998 | Kobayashi et al. | |
| 5,784,256 A | 7/1998 | Nakamura et al. | |
| 5,796,575 A | 8/1998 | Podwalny et al. | |
| 6,038,328 A | 3/2000 | Hsu | |
| 6,137,890 A | 10/2000 | Markow | |
| 6,144,368 A | 11/2000 | Ooka et al. | |
| 6,153,834 A | 11/2000 | Cole et al. | |
| 6,408,171 B1 | 6/2002 | Schuelke et al. | |
| 6,427,107 B1 | 7/2002 | Chiu et al. | |
| 6,452,811 B1 | 9/2002 | Tracy et al. | |
| 6,536,589 B2 | 3/2003 | Chang | |
| 6,746,797 B2 | 6/2004 | Benson et al. | |
| 6,757,157 B2 | 6/2004 | Lammintaus et al. | |
| 6,781,824 B2 | 8/2004 | Krieger et al. | |
| 6,819,946 B2 | 11/2004 | Hansson | |
| 6,838,810 B1 | 1/2005 | Bovio et al. | |
| 6,847,522 B2 | 1/2005 | Fan et al. | |
| 6,862,180 B2 | 3/2005 | Sawyer et al. | |
| 6,929,879 B2 | 8/2005 | Yamazaki | |
| 7,190,802 B2 | 3/2007 | Rains et al. | |
| 7,236,357 B2 | 6/2007 | Chen | |
| 7,297,439 B2 | 11/2007 | Yamazaki et al. | |
| 7,315,451 B2 | 1/2008 | Kim et al. | |
| 7,342,793 B2 | 3/2008 | Ristic-Lehmann et al. | |
| 7,352,584 B1 | 4/2008 | Sung | |
| 7,372,699 B2 | 5/2008 | Kim | |
| 7,412,267 B2 | 8/2008 | Eaton et al. | |
| 7,432,860 B2 | 10/2008 | Huynh | |
| 7,480,145 B2 * | 1/2009 | Ali | 361/708 |
| 7,505,270 B2 | 3/2009 | Kim | |
| 7,515,431 B1 | 4/2009 | Zadesky et al. | |
| 7,553,055 B2 | 6/2009 | Liu | |
| 7,558,054 B1 | 7/2009 | Prest et al. | |
| 7,558,057 B1 | 7/2009 | Naksen et al. | |
| 7,558,396 B2 | 7/2009 | Liu et al. | |
| 7,564,424 B2 | 7/2009 | Umehara | |
| 7,583,987 B2 | 9/2009 | Park | |
| 7,620,175 B2 | 11/2009 | Black et al. | |
| 7,663,607 B2 | 2/2010 | Hotelling et al. | |
| 7,668,332 B2 | 2/2010 | Williams et al. | |
| 7,688,574 B2 | 3/2010 | Zadesky et al. | |
| 7,697,281 B2 | 4/2010 | Dabov et al. | |
| 7,869,206 B2 | 1/2011 | Dabov et al. | |
| 8,218,321 B2 | 7/2012 | Foxenland | |
| 8,250,724 B2 | 8/2012 | Dabov et al. | |
| 8,270,915 B2 | 9/2012 | Sanford et al. | |
| 8,427,379 B2 | 4/2013 | Rothkopf et al. | |
| 8,477,492 B2 | 7/2013 | Rothkopf et al. | |
| 2002/0102870 A1 | 8/2002 | Burns et al. | |
| 2002/0107044 A1 | 8/2002 | Kuwata et al. | |
| 2002/0114143 A1 | 8/2002 | Morrison et al. | |
| 2003/0003945 A1 | 1/2003 | Saiki et al. | |
| 2003/0081392 A1 | 5/2003 | Cady et al. | |
| 2004/0084244 A1 | 5/2004 | Zurek et al. | |
| 2004/0203518 A1 | 10/2004 | Zheng et al. | |
| 2004/0252454 A1 | 12/2004 | Chen | |
| 2005/0014537 A1 | 1/2005 | Gammon et al. | |
| 2005/0088778 A1 | 4/2005 | Chen et al. | |
| 2005/0095745 A1 | 5/2005 | Sapir | |
| 2006/0067070 A1 | 3/2006 | Otsuki | |
| 2006/0098412 A1 | 5/2006 | Kim et al. | |
| 2006/0157842 A1 | 7/2006 | Goodwin | |
| 2006/0262500 A1 | 11/2006 | Huang et al. | |
| 2007/0058821 A1 | 3/2007 | Welsh et al. | |
| 2007/0081303 A1 | 4/2007 | Lam et al. | |
| 2007/0160228 A1 | 7/2007 | Yang et al. | |
| 2008/0025547 A1 | 1/2008 | Yun et al. | |
| 2008/0037765 A1 | 2/2008 | Finney et al. | |
| 2008/0037770 A1 | 2/2008 | Emmert | |
| 2008/0062660 A1 | 3/2008 | Weber et al. | |
| 2008/0069384 A1 | 3/2008 | Kim et al. | |
| 2008/0101026 A1 | 5/2008 | Ali | |
| 2008/0151503 A1 | 6/2008 | Aapro et al. | |
| 2008/0165139 A1 | 7/2008 | Hotelling et al. | |
| 2008/0165485 A1 | 7/2008 | Zadesky et al. | |
| 2008/0266774 A1 | 10/2008 | Tracy et al. | |
| 2008/0298021 A1 | 12/2008 | Ali et al. | |
| 2008/0316116 A1 | 12/2008 | Hobson et al. | |
| 2008/0316121 A1 | 12/2008 | Hobson et al. | |
| 2009/0015510 A1 | 1/2009 | Nakata et al. | |
| 2009/0049773 A1 | 2/2009 | Zadesky et al. | |
| 2009/0059485 A1 | 3/2009 | Lynch et al. | |
| 2009/0067141 A1 | 3/2009 | Dabov et al. | |
| 2009/0155681 A1 | 6/2009 | Lin et al. | |
| 2009/0160712 A1 | 6/2009 | Breiter et al. | |
| 2009/0185045 A1 | 7/2009 | Rosenblatt et al. | |
| 2009/0201652 A1 | 8/2009 | Chew et al. | |
| 2009/0245564 A1 | 10/2009 | Mittleman et al. | |
| 2009/0257189 A1 | 10/2009 | Wang et al. | |
| 2009/0257613 A1 | 10/2009 | Khamashta et al. | |
| 2009/0302804 A1 | 12/2009 | Park et al. | |
| 2010/0008040 A1 | 1/2010 | Weber et al. | |
| 2012/0044635 A1 | 2/2012 | Rothkopf et al. | |
| 2012/0044636 A1 | 2/2012 | Rothkopf et al. | |
| 2012/0053711 A1 | 3/2012 | Shedletsky et al. | |

FOREIGN PATENT DOCUMENTS

| | | |
|---|---|---|
| CN | 2757458 | 2/2006 |
| CN | 2779773 | 5/2006 |
| CN | 1870676 | 11/2006 |
| CN | 101529359 | 9/2009 |
| CN | 202217223 | 5/2012 |
| CN | 103221896 | 7/2013 |
| DE | 10252308 | 4/2004 |
| EP | 0534290 | 3/1993 |
| EP | 1209880 | 5/2002 |
| EP | 1257147 | 11/2002 |
| EP | 1441489 | 7/2004 |
| EP | 1732230 A2 | 12/2006 |
| EP | 1870956 | 12/2007 |
| EP | 2343872 | 7/2011 |
| EP | 2606407 | 6/2013 |
| GB | 2137425 | 10/1984 |
| JP | 2003111194 | 4/2003 |
| JP | 2004213498 | 7/2004 |
| JP | 2005130156 A | 5/2005 |
| KR | 20070047650 A | 5/2007 |
| WO | WO2008054969 | 5/2008 |
| WO | WO2008152438 | 12/2008 |
| WO | WO2009056143 | 5/2009 |

OTHER PUBLICATIONS

"[Comparison] Mounted parts inherited, while an arrangement inside is boldly changed," NE: Nikkei Electronics, Japan, Nikkei BP, published on Aug. 11, 2008, No. pp. 54-57.

"Complete analysis of iPhone," Tomohisa Takei et al., NE: Nikkei Electronics, Japan, Nikkei BP, published on Jul. 16, 2007, pp. 81-88.

"Cost Effective Integrated Housing and Printed Circuit Module for Battery Pack" Ho et al., ip.com Prior Art Database, Apr. 29, 2004, 6 pgs.

"iPod touch hardware review," PC Watch [online], URL http://pc.watch.impress.com/jp/docs/20071010/apple.htm, published Oct. 10, 2007.

AU Application No. 2011203145—Examiner's First Report dated Aug. 25, 2011.

CA Application No. 2,735,999—Office Action dated Sep. 12, 2011.

CN Utility Model Application No. 201020179389.8—Office Action dated Oct. 25, 2010.

CN Utility Model Application No. 201020179389.8—Office Action dated Feb. 16, 2011.

(56) References Cited

OTHER PUBLICATIONS

CN Utility Model Patent ZL200920177536.5—Evaluation Report dated Mar. 23, 2012.
CN Utility Model Patent ZL201120303417.7—Evaluation Report dated May 22, 2012.
EP Application No. 09790546.7—Office Action dated Dec. 21, 2011.
JP Application No. 2011-526076—Office Action (English translation) dated Sep. 9, 2011.
JP Application No. 2011-526076—Final Office Action (English translation) dated Feb. 22, 2012.
KR Application No. 10-2011-7021855—Office Action dated Feb. 6, 2012.
PCT Application No. PCT/US2009050879—Partial Search Report dated Oct. 7, 2010.
PCT Application No. PCT/US2009050879—Int'l Search Report/Written Opinion dated Dec. 27, 2010.
PCT Application No. PCT/US2009050879—Int'l Preliminary Report on Patentability dated Mar. 8, 2011.
PCT Application No. PCT/US2011/048404—Int'l Search Report/Written Opinion dated Feb. 13, 2012.

* cited by examiner

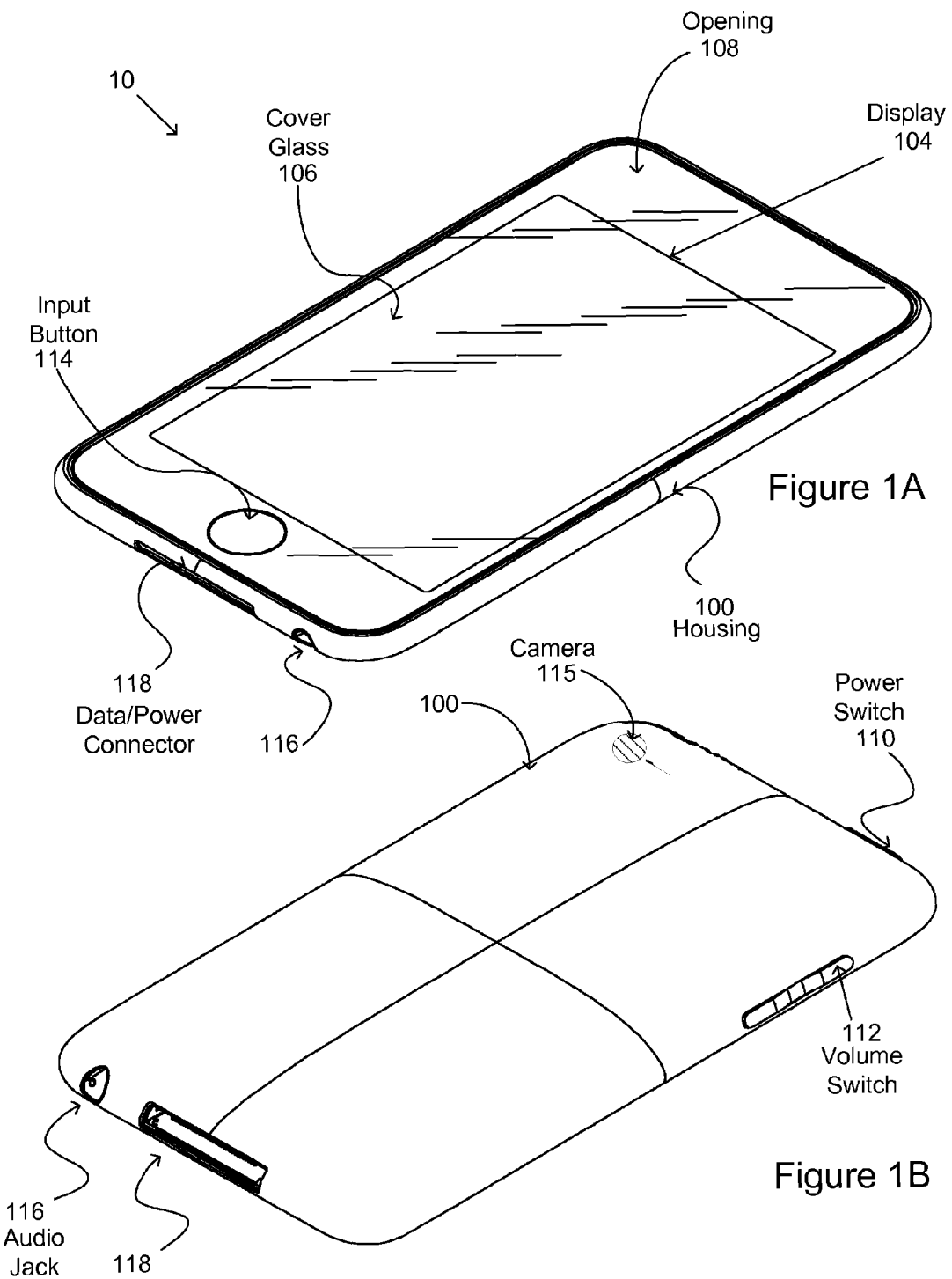

INTERNAL FRAME OPTIMIZED FOR STIFFNESS AND HEAT TRANSFER

CROSS REFERENCE TO RELATED APPLICATIONS

This U.S. Patent Application is a continuation of and claims priority under 35 U.S.C. §120 to co-pending U.S. application Ser. No. 12/859,702, filed Aug. 19, 2010 and entitled "INTERNAL FRAME OPTIMIZED FOR STIFFNESS AND HEAT TRANSFER" by Rothkopf et al. now U.S. Pat. No. 8,391,010 issued Mar. 5, 2013, which is incorporated by reference in its entirety for all purposes.

BACKGROUND

1. Field of the Invention

The invention relates to consumer electronic devices and more particularly, methods and apparatus associated with the thermostructural design of consumer electronic devices.

2. Description of the Related Art

From a visual stand point, users often find compact and sleek designs of consumer electronic devices more aesthetically appealing. As an example, portable electronic device designs that are both thin and light-weight are often popular with consumers. In some thin device designs, one face of the device is almost entirely dedicated to a viewable portion of the display while other input/output components are arranged around the sides and back of the device opposite the display. Typically, the display is surrounded by a thin enclosure where the display driver, main logic board, battery and other interface circuitry are all packaged within the thin enclosure.

In the devices described in the previous paragraph, components such as the processor and the display and other internal components generate heat. To preserve the longevity of electrical components in the device as well as for user comfort, it is desirable to prevent thermal hot spots from developing within the enclosure or on the surface of the enclosure. When a thin and compact enclosure is used, there is a minimum amount of space available for providing heat conduction paths within the enclosure or for adding thermal mass that acts as a heat sink. Also, when the over-all weight of the device is minimized and manufacturability of the device is considered, it is undesirable to include parts whose sole purpose is only to address thermal issues.

In view of the above, enclosure components are desired that address thermal issues while satisfying weight, structural and packaging constraints associated with a light-weight portable electronic device employing a thin and compact enclosure.

SUMMARY

Broadly speaking, the embodiments disclosed herein describe structural components well suited for use in consumer electronic devices, such as laptops, cellphones, netbook computers, portable media players and tablet computers. In particular, structural components are described that address both strength and thermal issues associated with the design of a light-weight consumer electronic device with a thin and compact enclosure. Methods for forming these structural components are also described.

In one embodiment, the consumer electronic device can be a thin portable electronic device with a display. The internal arrangement of the components of the thin portable electronic device can be viewed as a number of stacked layers. The stacked layers can be associated with a particular height relative to the thickness of the device. Various device components, such as but not limited to display circuitry, a CPU, speakers, memory, wireless communication circuitry and a battery can be arranged and distributed on the stacked layers.

One of the stacked layers can be an internal frame. The internal frame can be coupled to the external housing of the thin portable electronic device. The internal frame can be configured to provide heat distribution capabilities, such as heat spreading, for components that generate heat located in layers adjacent to the internal frame. Further, the internal frame can be used to add to the overall structural stiffness of the device. In addition, the internal frame can be used as an attachment point for other device components used in the device, such as the display.

In one embodiment, the internal frame can be an internal metal frame formed from a number of layers of different metals. For instance, the internal metal frame can include a middle layer formed from a first metal situated between two outer layers formed from a second metal. The first metal and the second metal can each be selected for their strength and/or heat conduction properties. Further, the thickness of each of the layers can be varied to enhance either its strength or thermal characteristics. In one embodiment, the different metal layers of the internal metal frame can be joined using a cladding process.

In a particular embodiment, the first metal used in the middle layer can be selected primarily for its heat conduction properties such that the middle layer can act as a heat spreader while the second metal used in the two outer layers can be primarily selected to improve the strength of the internal metal frame and hence, the overall stiffness of the device. In general, the first metal and the second metal can selected to improve one or more of heat conduction property, a strength property (e.g., stiffness), an environment property (e.g., corrosive resistance) and a cosmetic property (e.g., appearance of the device). As an example, the middle layer can be formed from copper, which is selected for its thermal properties, and the two outer layers can be formed from stainless steel, which is selected for its strength properties. In another embodiment, the second metal used in the two outer layers can be selected to allow each of the outer layers to act as heat spreaders while the first metal used in the middle layer can be selected for its strength properties.

When the first metal used in the middle layer of the internal metal frame is selected primarily selected for its thermal properties so that the middle layer can act as a heat spreader, one or more apertures can be provided in the outer layers of the internal metal frame. Each aperture can be located proximate to a heat generating component within the device. A thermal bridge can be provided that thermally links a surface associated with the heat generating component to the middle layer of the internal metal frame via the aperture in the outer layer proximate to the heat generating component. In particular embodiments, the thermal bridge can be formed from a soldering material or a thermally conductive adhesive tape.

Other aspects and advantages will become apparent from the following detailed description taken in conjunction with the accompanying drawings which illustrate, by way of example, the principles of the invention.

BRIEF DESCRIPTION OF THE DRAWINGS

The described embodiments will be readily understood by the following detailed description in conjunction with the accompanying drawings, wherein like reference numerals designate like structural elements, and in which:

FIG. 1A shows a top view of a portable electronic device in accordance with the described embodiments.

FIG. 1B shows a bottom view of a portable electronic device in accordance with the described embodiments.

DETAILED DESCRIPTION OF THE DESCRIBED EMBODIMENTS

Figure 1C:
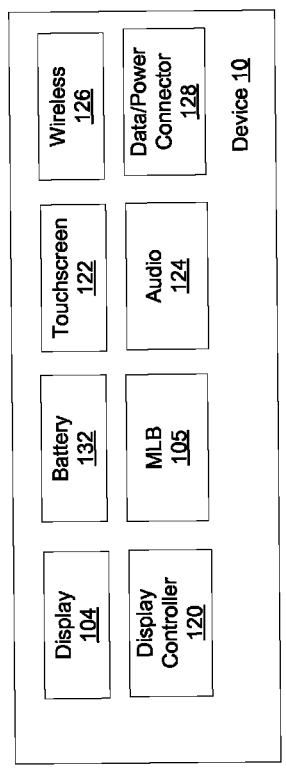
FIG. 1C shows block diagram of a portable electronic device in accordance with the described embodiments.

In the following detailed description, numerous specific details are set forth to provide a thorough understanding of the concepts underlying the described embodiments. It will be apparent, however, to one skilled in the art that the described embodiments can be practiced without some or all of these specific details. In other instances, well known process steps have not been described in detail in order to avoid unnecessarily obscuring the underlying concepts.

A first factor that can be considered in the thermostructural design of a thin and compact portable electronic device can be the placement of the components associated with the user interface. After determining an outer placement of the components, factors, such as internal packaging, weight, strength and stiffness needed to protect the device during expected operational conditions, can be considered in regards to the design of the housing. Then, thermal issues, such as preventing internal hot spots from developing can be considered. These design factors, when considered together, can each affect one another. Thus, the design of the device can be an iterative process.

As an illustration of the thermostructural design process for a portable device, a device design is discussed in view of the factors described in the preceding paragraphs. Typically, a portable device can include a display. The display and an input mechanism can usually be placed on one face of the device. If desired, a thin-profile housing can be specified that surrounds and encloses all but the portion of the display visible to the user. The face opposite the display can be mostly structure associated with housing but can include apertures for other input devices, such as a camera.

Along the edges of the housing, various input/output mechanisms can be placed, such as volume switches, power buttons, data and power connectors, audio jacks and the like. The housing can include apertures to accommodate the input/output mechanisms. The locations at which the input/output mechanisms are placed can be selected to enhance the usability of the interface under conditions for which the device is intended to operate. For instance, for a device intended to be operated with a single hand, the input mechanisms, such as an audio control switch, can be placed at a location that are easily finger operated while the device is held in the palm of the hand. Further, output mechanisms, such as an audio jack, can be placed at locations that do not interfere with holding the device, such as on a top edge of the device.

Once the components of the user interface are placed, device components that connect to and allow the portable electronic device to operate for its intended functions can be packaged within the enclosure. Examples of internal device components can include speakers, a microphone, a main logic board with a processor and memory, non-volatile storage, data and power interface boards, a display driver and a battery. Some flexibility can be afforded in regards to the locations of the internal device components as long as sufficient space for needed connectors between components is available. Also, approaches, such as custom-shaped PCBs or batteries, can be employed to allow available internal spaces to be efficiently utilized.

Once the user interface has been designed and the internal components are packaged in a suitably compact housing, thermal issues can be considered. Many internal components generate heat. To prevent the heat from building up in certain locations and possibly damaging the internal components, mechanisms may be needed to dissipate and conduct heat internally. The compact design of these devices can leave little room for convective cooling, i.e., allowing air to circulate in the device to dissipate heat. Thus, other approaches may be needed to address internal cooling issues.

One approach to solving the cooling problem can be to provide one or more structures configured to conduct heat away from and to different internal locations within the device. Besides being used for cooling, the structures can also be used to enhance to the structural properties of the device, such as adding to the over-all stiffness of the device. In particular embodiments, internal frames designed to satisfy thermal and structural constraints associated with the design and operation of a portable electronic device are described. The internal frames can be configured to conduct and dissipate heat generated within the enclosure. Further, the internal frames can be configured to add to the over-all strength of the device.

The thermostructural design of these internal frames and their use in portable electronic devices are discussed below with reference to FIGS. 1A-5. However, those skilled in the art will readily appreciate that the detailed description given herein with respect to these figures is for explanatory purposes only and should not be construed as limiting. In particular, with respect to FIGS. 1A-1D, an overall configuration of a portable electronic device is described. The device can include an internal frame with heat conduction capabilities configured to satisfy thermal and structural constraints associated with the design and operation of the device, which is discussed. In FIGS. 2A-2C, various embodiments of the internal frame are shown and discussed. With respect to FIGS. 3A and 3B, internal structures and materials associated with the internal frames are described. A coupling of the internal frame to various device components and associated manufacturing methods are discussed in relation to FIGS. 4A, 4B and 5. Finally, portable computing device configured as a media player is described with respect to FIG. 6.

FIGS. 1A and 1B show a top and side view of a portable electronic device 10 in accordance with the described embodiments. The device 10 can include a housing 100 that surrounds a display 104. The housing 100 can be designed with a relatively thin-profile. The housing 100 provides an opening 108 in which the display 104 is placed. A cover glass 106 is placed over the display 104. The cover glass 106 helps to seal the opening 108. The device 10 can include a touch screen associated with the display (not shown).

A significant fraction of the area of the top face of the device 10 is occupied by the display 104. This fraction can be smaller or larger if desired. Also, the fraction dedicated to the display can vary from device to device. In some embodiments, the device 10 may not even include a display.

As previously described above, the display 104 can be a component in a user interface associated with the device 10. Other device components that contribute to the user interface or the over-all operation of the device 10 are distributed at various locations on the housing 100 of the device 10. The placement of these components can affect the internal packaging and hence the location of heat generating components within the device.

As an example of an outer arrangement of the device components, an input button 114 is located on the front face. In one embodiment, the input button 114 can be used to receive an input indicating a desire to return the device to a particular state, such as a "home" state. A volume switch 112 that can be used to adjust a volume associated with various audio applications implemented on the device can be located on one side of the housing 100. A power switch 110 is located on the top side of device 10 and an audio jack and an opening for a data/power connector is located on a bottom side of the housing 100 opposite the top side. The bottom side of the housing 100 includes an aperture. A lens 115 for a camera can be placed in the aperture.

Figure 2A:
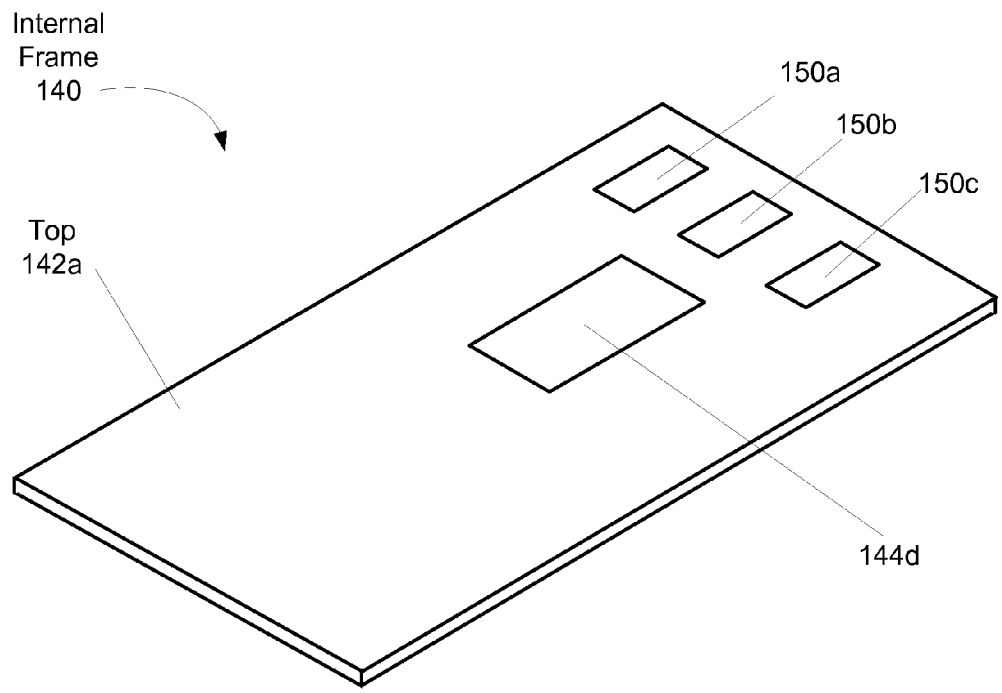
FIGS. 2A and 2B show top and bottom views of an internal frame in accordance with the described embodiments.
Figure 2B:
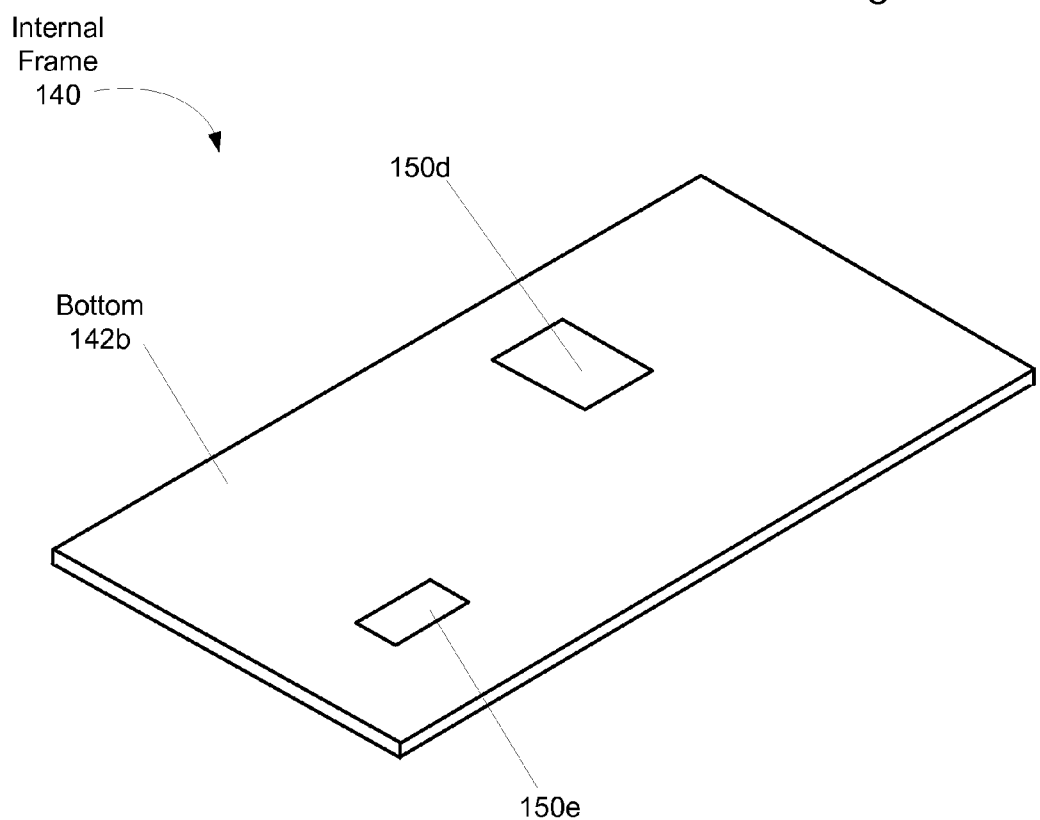
Figure 2C:
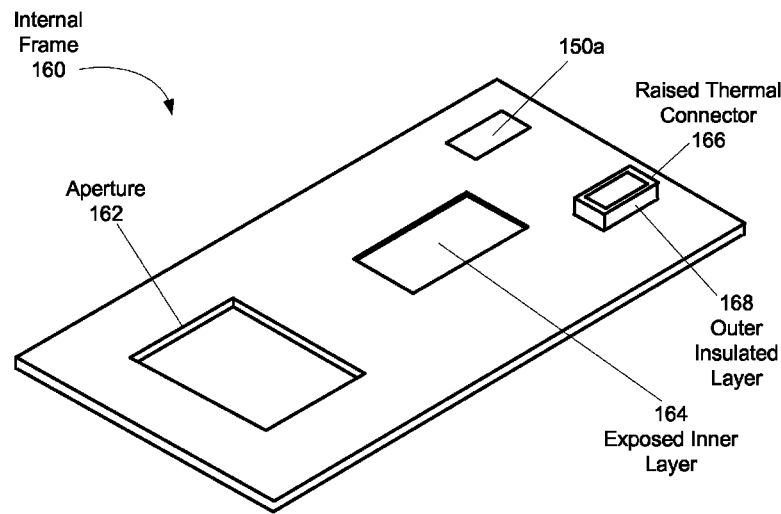
FIG. 2C shows a top view of an internal frame in accordance with the described embodiments.

FIG. 1C shows a block diagram of the device 10. A display 104, a battery 132, a touchscreen 122, a wireless communication interface 126, a display controller 120, audio components 124 (e.g., speakers), can each be coupled to a main logic board (MLB) 105. The device 10 can include other components (not shown), such as a Sim card, a microphone and a non-volatile memory and is not limited to the components shown in FIG. 1C. The MLB 105 can include a processor and a memory. The processor and memory can execute various programming instructions to allow the device perform various functions. The user interface, described above, can be considered to allow a user to select and adjust the various functions that are available on the device 10. In particular embodiments, these functions can be provided as user selectable application programs that are stored on the device.

Figure 1D:
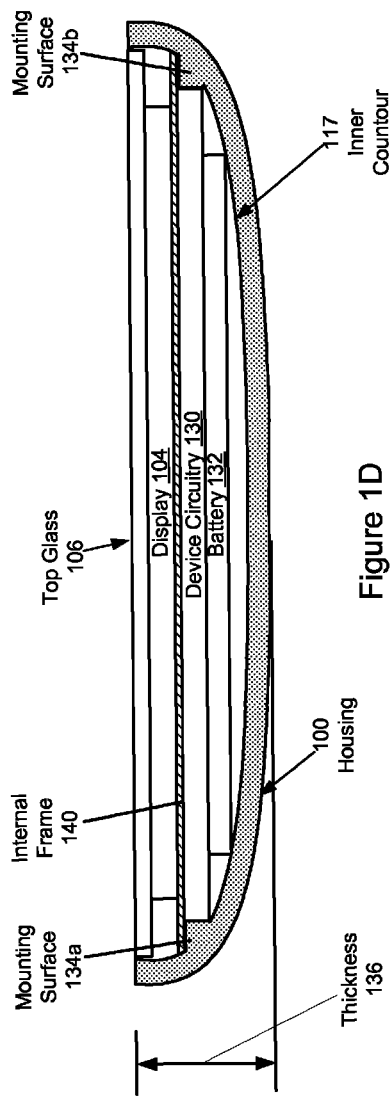
FIG. 1D shows a cross-sectional view of a portable electronic device in accordance with the described embodiments.

FIG. 1D shows a cross-sectional view of a portable electronic device 10 in accordance with the described embodiments. An enclosure can be formed from the top glass 106 and the housing 100. Other enclosure configuration are possible and the described embodiments are not limited to this example. As is illustrated in FIG. 1D, the housing 100 can provide a cavity that is covered by the top glass 106. The housing 100 can include an outer surface and an inner surface where the inner contour profile 117 of the inner surface can be different from the outer contour profile of the housing 100.

Within an enclosure, such as an enclosure including the top glass 106 and the housing 100, various internal device components, such as device components associated with the user interface that allow the device 10 to operate for its intended functions, are packaged. For the purposes of discussion, the internal device components can be considered to be arranged in a number of stacked layers. The height of each of the stacked layers can be specified relative to the overall thickness 136 of the device. For instance, a height of the middle of the top glass 106 can be specified as a first fraction of the overall thickness 136 while a height of the battery 132 can be specified as a second fraction of the overall thickness 136.

The display screen of the display 104 can be located directly below the top glass 106. In one embodiment, the display screen and its associated display driver circuitry can be packaged together as part of the display 104. Below display 104, device circuitry 130, such as a main logic board or circuitry associated with other components, and a battery 132, which provides power to the device 10, can be located.

As previously described and as shown in the FIG. 1D, the internal components can be tightly packed leaving little room for pathways that allow cooling via air circulation to be effective for the internal components that generate heat. Another approach to addressing internal heating issues that can be used in conjunction with or in lieu of convective air cooling is to place a thermally conductive material proximate to the heating source. The thermally conductive material can absorb and conduct heat away from an internal heat source, such as a heat generating internal device component, to lower a temperature near the heat source during operation of the device.

In one embodiment, the thermally conductive material can be incorporated into an internal structure associated with the device 10, such as internal frame 140. The internal frame 140, which is described in more detail with respect to the following figures, can be configured to conduct heat away from one or more device components and to add to the overall strength of the device. For instance, the internal frame 140 can be configured to add to the overall stiffness of the device 10, such as an ability to resist bending moments experienced by the housing 100.

In the FIG. 1D, the internal frame 140 is located in at a height below the display 104 and above the device circuitry 130. The internal frame 140 can be placed in this location to draw away heat generated by the display circuitry. Further, one or more heat sources associated with the device circuitry 130 can be positioned proximate the internal frame 140 to allow heat from these components to be conducted into the internal frame 140 and away from the heat source.

Other packaging configurations are possible. Thus, in other embodiments, the internal frame 140 can be located at different heights relative to the overall thickness 136 of the device and can also be located proximate to different device components. Further, a device, such as 10, can include multiple frames, such as 140 and described embodiments are not limited to a use of a single internal frame 140.

In one embodiment, the internal frame 140 can be used as an attachment point for other device components. For example, the internal frame 140 can be attached to mounting surface, such as 134a and 134b, on the housing 100 via fasteners or using a bonding agent. Then, other device components, such as the display 104 can be coupled to the internal frame 140 rather than directly to the housing 100. One advantage of coupling the display 104 to the housing via the internal frame 140 is that the display can be somewhat isolated from bending moments associated with the housing 100, i.e., bending moments generated on the housing can be dissipated into the internal frame 140. Isolating the display 104 from bending moments associated with the housing 100 can prevent damage to the display 104, such as cracking, from occurring.

FIGS. 2A and 2B show top 142a and bottom 142b views of an internal frame 140 in accordance with the described embodiments. In one embodiment, the internal frame can be formed as a multi-layered sheet, such as a sheet including a number of metal layers (see FIGS. 3A and 3B for a cross-section of the internal frame 140 including its different layers). In a particular embodiment, the internal frame 140 can be formed having a middle layer of a first material sandwiched between two outer layers of a second material. The materials used in the middle layer and the outer layer can be selected for their thermal properties, such as thermal conductivity, and/or strength properties.

In one embodiment, the first material used in the middle layer can be selected primarily for its thermal properties while the second material used in the outer layers can be selected primarily for its strength properties. As an example, a middle layer of copper can be sandwiched between two layers of a stainless steel, such as Iconel.™ The thermal conductivity of the copper is about 25 times greater than the Iconel,™ whereas the stainless steel is much more resistant to bending than the copper, which can be quite pliable. In one embodiment, the middle layer can make up about 50% of the thickness of the internal frame and the outer layers can each make up about 25% if the thickness of the internal frame. When the middle layer is copper and the outer layers are stainless steel, this configuration retains about 94% of the stiffness of an internal frame of the same thickness made from just stainless steel.

Other combinations of material are possible and the embodiments describe herein are not limited to a combination of copper and stainless steel. For instance, other metal combinations, such as a aluminum and stainless steel, can also be employed. Further, non-metal and metal materials or different types of non-metal materials can be combined to form an internal frame, such as 140.

In a particular embodiment, an internal frame, such as 140, having a copper layer sandwiched between to two stainless steel layers, can be formed using a cladding process. In one implementation of a cladding process, a sheet of copper can be compressed at a high pressure between two sheets of stainless steel to join the sheets. As an example, the sheets can be squeezed with a high pressure between two rollers as part of the cladding process. The sheets formed via the cladding process can be cut to form the internal frame 140 shown in the figures.

In metallurgy, cladding is the bonding together of dissimilar metals. It is distinct from welding or gluing as a method to fasten the metals together. Cladding can be often achieved by extruding two metals through a die as well as pressing or rolling sheets together under high pressure. The cladding process "metallurgically" bonds metals together, producing a continuous strip that can be annealed, rolled, and slit to meet very precise electrical, thermal, and/or mechanical end-use needs. Clad inlays or overlays on one or both base metal surfaces with precious or non-precious metal combinations can be provided.

In general, cladding can refer to a deposition process where one metal is coated with another metal or a substrate material, which can be non-metallic, is coated with another metal. In some cladding processes, the metal can be melted on to the substrate, such as via a laser cladding process. Thus, the embodiments described herein are not limited to a cladding process where metal sheets are joined together under high-pressures, such as via rollers.

For an internal frame, such as 140, where the middle conductive layer is sandwiched between two outer layers with a significantly lower thermal conductivity, the outer layers can include one or more apertures that expose the middle conductive layer. The apertures can be provided to allow a better thermal link to be formed between the middle conductive layers and a heat generating component. In particular embodiments, a surface of the heat generating component can be thermally linked to the middle conductive layer via soldering material or via thermally conductive tape. Double-sided thermally conductive tapes are often used to join heat sinks to components, such as processors, in computer applications. In the embodiments described herein, the double-sided thermally conductive tape or a soldering material can be used to bond and hence thermally link a surface of a heat generating component to the internal frame 140.

On the internal frame 140, the position of the apertures can be selected to be close to heat generating components within the portable device. A number of apertures, 150a-f, are shown on the top 142a and bottom 142b of the internal frame 140. As is shown, the aperture locations can vary from the top 142a to the bottom 142b of the internal frame 140. As is shown in FIGS. 2A and 2B, the aperture locations on the top 142a are at different locations than on the bottom 142b. Further, there are more apertures on the top 142a than on the bottom 142b of the internal frame 140.

In general, the locations of apertures in outer layer of an internal frame 140 can vary from device to device depending on the heat generating components used with each device and the internal packaging schema selected for each device. In one embodiment, the apertures can be located on only one side of the internal frame, such as only the top side or the bottom side. In another embodiments, the outer layers can be thermally conductive and the middle layer can be provided for strength, such as stainless steel sandwiched between two copper layers. In this example, apertures in the outer layer are not necessary for thermal linking purposes because a surface of a heat generating source can be directly bonded to the thermally conductive outer layers.

FIG. 2C shows a top view of an internal frame 160 in accordance with the described embodiments. In one embodiment, the internal frame 160 can include one or more apertures, such as 162, that go entirely through the internal frame 160. The one or more apertures can be used to place a component, such as a connector through the internal frame 160. In addition, apertures that go entirely through the frame 160 can be provided to fasten the internal frame 160 to another component, such as a device housing 100 described with respect to FIGS. 1A, 1B and 1D.

As described above with respect to FIGS. 2A and 2B, the internal frame 160 can include one or more apertures in its outer layers that expose a solid middle layer. In one embodiment, the apertures can be filled-in with a material the same as or different from the material used in the middle layer. Aperture 150a is an example of a filled-in aperture. In another embodiment, the apertures may not be filled in and thus, a slight recess or cavity is possible where an aperture is provided to expose the middle conductive layer. Aperture 164 is an example of an aperture in the outer layer of the internal frame 160 that forms a cavity.

In one embodiment, a raised thermal connector, such as 166, can be provided. The raised thermal connector 166 can be formed from a thermally conductive material such as a copper. The raised thermal connector 166 can be used to thermally link a heat source located at some height above the internal frame 160 to a conductive layer of the internal frame, such as the middle layer. A raised thermal connector can be used when a heat generating component is located at a distance above the connector that is too large to use direct soldering to provide the thermal link. In one embodiment, the raised thermal connector 166 can be thermally insulated via an outer insulation layer, such as 168.

In a particular embodiment, the raised thermal connector 166 can be coupled to the internal frame 160 after it is formed. For example, the raised thermal connector 166 can be soldered or taped onto the internal frame 160. In one embodiment, when apertures are provided in the outer layers to expose a thermally conductive middle layer, a raised thermal connector 166 can be provided at one of these locations to thermally link, via the connector, a surface of a heat generating device component to the middle layer of the device frame.

Figure 4A:
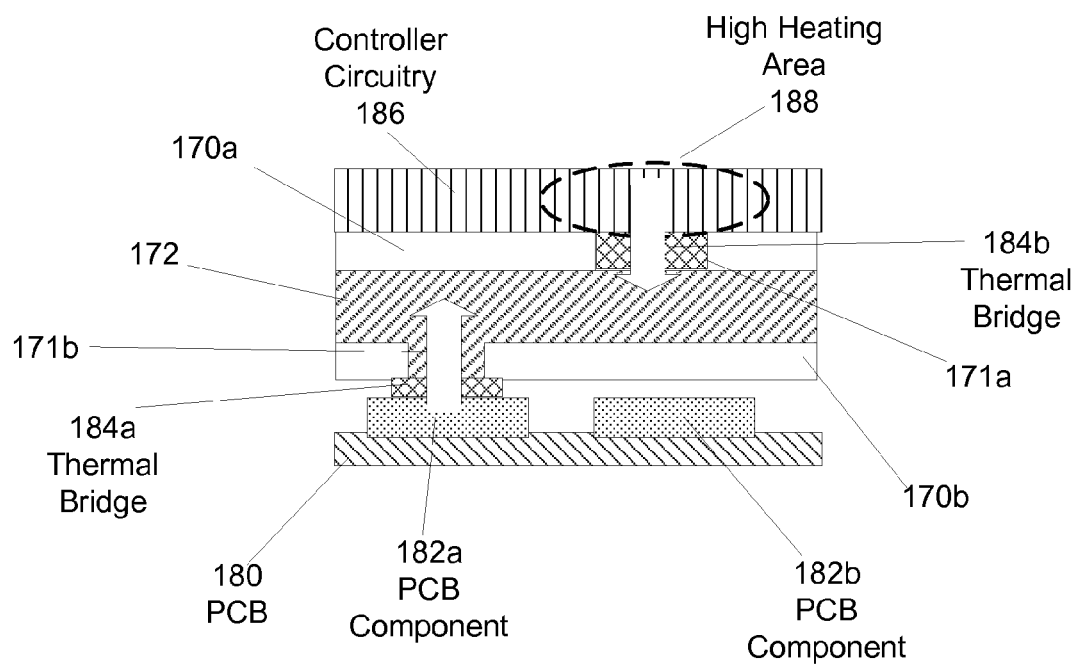
FIGS. 4A-4B shows a cross-sectional view of the internal frame thermally linked to a number of device components in accordance with the described embodiments.
Figure 4B:
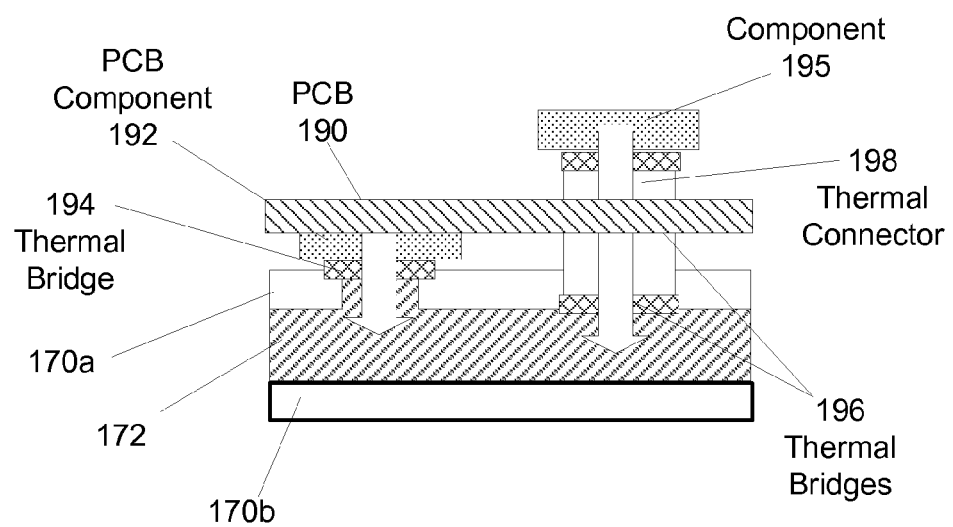

An example of a raised thermal connector positioned in this matter is also described with respect to FIG. 4B.

Figures 3A, 3B:
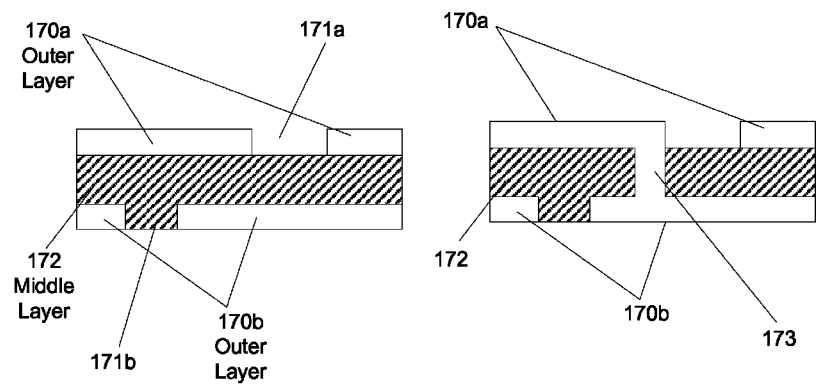
FIGS. 3A-3B shows a cross-sectional view of the internal frame in accordance with the described embodiments.

FIGS. 3A-3B shows a cross-sectional view of an internal frame, such as a cross-section that can be used in internal frame, such as 150 or 160 (Internal frame 150 and 160 are described with respect to FIGS. 2A-2C.). In FIG. 3A, a cross-section including three layers is shown. The three layers include outer layers 170a and 170b and a middle layer 172 disposed between these two outer layers.

The thicknesses of each of the middle and outer layers can vary. In one embodiment, the thicknesses of each of the outer layers can be approximately the same. In another embodiment, the thicknesses of each of the outer layers can be different. The thickness of the middle layer can be the same or different than the thicknesses of each of the two outer layers. In a particular embodiment, the thicknesses of each of the two outer layers can be proximately the same where a combined thickness of the two outer layers is proximately equal to the thickness of the middle layer.

The thicknesses of each layer can be varied to adjust the strength, weight, and/or thermal properties of the internal frame. For instance, a stainless steel layer can be made thicker to increase an overall strength of the internal frame. In another example, a copper layer can be made thicker to increase the thermal mass of the internal frame.

A first aperture 171a can be provided in the top outer layer 170a and a second aperture 171b can be provided in the bottom outer layer 170b. The aperture 171a in the top outer layer 170a is shown as not filled in so that a small cavity is formed proximate to the aperture. The aperture 171b in outer layer 170b is shown as filled with the same material as the middle layer. A few methods for filling in an aperture, such as 171b, are described in the following paragraph.

In one embodiment, the aperture 171b can be totally or partially filled in during the cladding process. For instance, the outer and middle layers can be sufficiently squeezed together such that a portion of the middle layer protrudes through the aperture. In another embodiment, the apertures can be filled in after the cladding process. The apertures can be filled with a material that is the same or different than the material of the middle layer. For example, the cavity formed from the aperture can be filled with a soldering material that is provided to thermally link the middle layer 172 to a surface of a heat generating component. As another example, the internal frame can be dipped into another material to fill in one or more of the apertures.

FIG. 3B shows another embodiment of a cross section that can be utilized with an internal frame. In this embodiment, a middle layer 172 is sandwiched between two outer layers 170a and 170b. However, a portion of the middle layer 172 is somewhat thermally isolated from another portion of the middle layer. The thermal isolation is illustrated by the material 173 that extends from the top layer 170a to the 170b.

In some embodiments, it may be desirable to reduce the heat transfer rate between one portion of the internal frame and another portion of the internal frame. This can be accomplished by placing a material with a lower conductivity between two portions of the thermally conductive middle layer. For instance, the middle layer 172 can be formed from two or more separate strips of material that are sandwiched between sheets including the outer layers. During the cladding process, in the gap between the strips, the outer layers can be squeezed together to join the top and bottom layers and provide a reduced heat transfer rate between the portions of the middle layer 172. A similar process, as described in the previous paragraph, can be employed to thermally link two layers. For instance, in FIG. 3B, if the top layers are a thermally conductive material, such as copper, and the middle layer is a less conductive material such as stainless steel formed from separate strips, then, during the cladding process, the top and bottom copper layers can be squeezed together through the gaps in the stainless steel strips to thermally link the top and bottom copper layers.

FIGS. 4A-4B shows a cross-sectional view of an internal frame thermally linked to a number of device components in accordance with the described embodiments. A typical direction of heat transfer into the middle layer is indicated by the arrows. In FIG. 4A, different device components are shown linked to a cross section of the internal frame shown in FIG. 3A. In this example, the middle layer 172 of the internal frame can be formed from a thermally conductive material, such as copper, while the outer layers can be formed from a material that is stronger than the copper, such as stainless steel. Apertures can be provided in the outer layers to expose the middle layer to allow for a better thermal link to be formed between the middle layer and surfaces of heat generating components proximate to each aperture.

In FIG. 4A, controller circuitry 186 can be located above top layer 170a. For instance, the controller circuitry 186 can be display circuitry as was described with respect to FIG. 1D. A PCB 180 can be located below the internal frame. The PCB 180 can include a number of components, such as 182a and 182b. In one embodiment, the PCB can be a main logic board that includes a processor and a memory.

The aperture 171a in outer layer 170a can be located below a high heating area 188 associated with the controller circuitry 186. The aperture 171a is not filled in. A thermal bridge 184b, such as a soldering material, can be used to provide a thermal link between a surface of the device circuitry 186 and the middle layer 172. The use of thermal bridge, such as 184b, can be desirable because an air gap between the high heating area and the thermal bridge can act as an insulator that prevents heat from being conducted into the middle layer. Leaving a cavity in which the thermal bridge can be placed can allow the controller circuitry to be placed closer to the internal frame since additional space between the internal frame and the surface of the controller circuitry is not needed for the thermal bridge. During operation, heat generated in the high heating area 188 can be conducted into the middle layer 172 and away from the high heating area 188. Thus, the temperature proximate to the high heating area can be reduced via the internal frame.

The aperture 171b in the outer layer 170b is filled in. A thermal bridge 184a is provided between a surface of the PCB component 182a and the middle layer 172. The thermal bridge 184a can increase a space between the PCB component 182a and the internal frame since the aperture 171b is filled in and does not provide a cavity in which the thermal bridge can sit. In one embodiment, the thermal 184a bridge can be a thermally conductive adhesive, such as a double-sided adhesive tape.

When thermal bridge 184a is used near an aperture, such as 171b, the thermal bridge 184a can be larger or smaller than the area of the aperture. In the example in FIG. 4A, the thermal bridge is shown as being bigger than the aperture 171b. The area of the thermal bridge, such as 184a, can be selected to ensure that a proper bond is maintained during operation of the device.

As is shown in FIG. 4A, only certain components of a PCB, such as the components that generate the most heat, may be thermally linked to the internal frame whereas less hot components may not be thermally linked to the internal frame. To illustrate this point, PCB component 182a is shown thermally linked to the internal frame while PCB component 182b is not shown thermally linked to the internal frame. Depending on a design of a particular board and the number of its associated components, one or more components associated with the board can be thermally linked to the internal frame.

In FIG. 4B, a cross sectional view of device components thermally linked to an internal frame is shown. In the cross section illustrated in FIG. 4B, a top layer 170a of the internal frame includes two apertures that expose a thermally conductive middle layer 172. The bottom layer 170b does not include any apertures in this cross section. On the top layer 170a, one of the apertures proximate to thermal bridge 194 is filled-in while another of the apertures proximate to thermal bridge 196 is not filled in. A PCB 190 including a PCB component 192 is located above the internal frame. Another device component 195 that is not associated with the PCB 190 is shown located above the PCB 190.

The PCB board is orientated so that a heat generating surface of the PCB component faces the internal frame. When a thermally conductive internal frame is employed, the orientation/location of other internal components, such as a PCB, can be adjusted so that surfaces associated with heat generating components can be thermally linked to the internal frame. Further, the desire to facilitate thermal linkage between a device component on a PCB and the internal frame can also be a factor in the design of the PCB, i.e., the device component can be arranged on the PCB such that a thermal linkage is easily facilitated.

In FIG. 4B, a surface of the PCB component 192, which is a heat generating component, is shown thermally linked to the middle layer 172 of the internal frame via thermal bridge 194. In addition, a surface of the component 195, which is also a heat generating component, is shown linked to middle layer 172 of the internal frame via thermal connector 198. The thermal connector 198 is coupled to the middle layer 172 and a surface of the device component 195 via thermal bridges 196. As previously described with respect to FIG. 2C, the thermal connector 198 can include an outer thermally insulating layer surrounding a thermally conductive core. In this example, the thermal connector 198 is shown extending above the level of the PCB 190 to reach the heating generating component 195.

Figure 5:
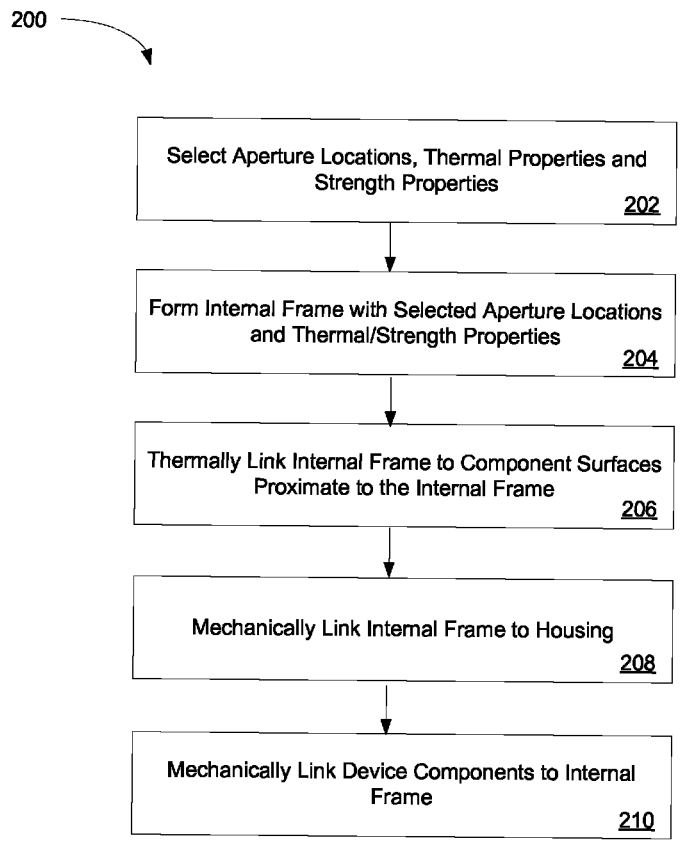
FIG. 5 is flow chart of a method of manufacturing a portable electronic device with an internal frame designed with specific thermostructural properties in accordance with the described embodiments.

FIG. 5 is a flow chart of a method 200 of manufacturing a portable electronic device with an internal frame designed with specific thermostructural properties in accordance with the described embodiments. In 202, an internal frame including a number of material layers can be configured. The configuration process can involve selecting a number of layers, a thickness of each layer and the strength and thermal properties desired for each layer. The strength and thermal properties desired for each layer can affect a material selected for each layer.

In the embodiment, where a layer selected for its thermal properties is sandwiched between two outer layers selected to add strength to the internal frame, one or more apertures can be configured in the outer layers. These apertures can be provided to allow a better thermal link to be formed between the middle layer of the internal frame and a heat generating surface of an internal device component. In 202, a placement of these apertures can be determined.

In 204, the internal frame with the selected aperture locations, thermal and strength properties can be generated. In one embodiment, the internal frame can be formed using a cladding process. In 206, during the assembly process for the electronic device, surfaces associated with heat generating components within the electronic device can be thermally linked to the internal frame. In 208, the internal frame can be mechanically linked to the housing of the electronic device. In 210, one or more device components can be mechanically linked to the internal frame.

In some embodiments, a device component, such as a display, can be both mechanically and thermally linked to the internal frame. In other embodiments, a device component can be mechanically linked but not thermally linked to the internal frame. In yet other embodiments, a device component can be thermally linked to the internal frame and mechanically secured to the housing via other structural components.

In particular embodiments, the portable computing device can be assembled using a computer aided manufacturing and assembly process. The computer aided manufacturing and assembly process can involve the use of multiple devices, such as multiple devices configured in an assembly line configuration. For instance, a computer aided machine can be configured to form the apertures at different location by removing material after the cladding process or by forming apertures in the sheets prior to the cladding process. As another example, a robotic device can be configured to thermal link a heat generating component to the internal frame, such as via a soldering process.

Figure 6:
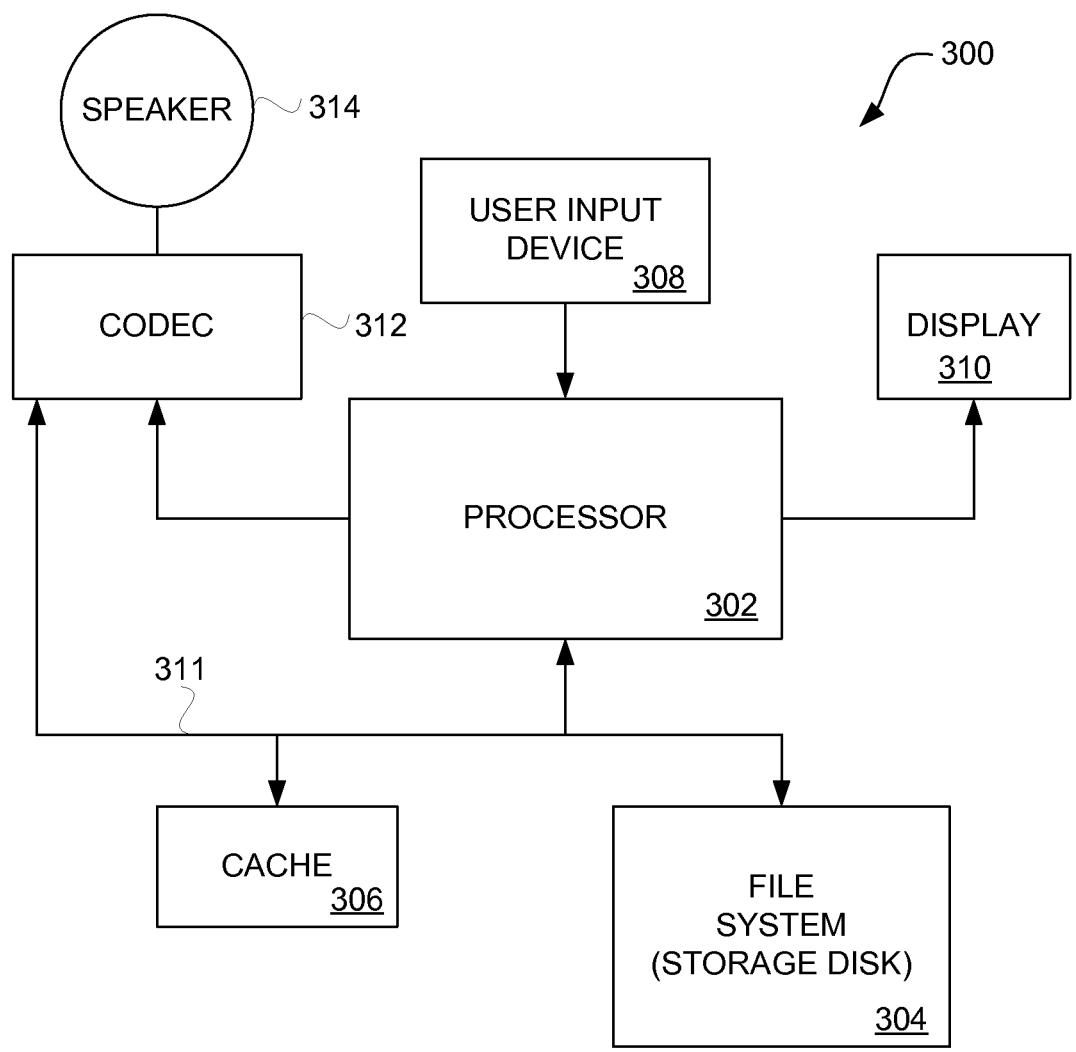
FIG. 6 is a block diagram of a portable computing device configured as a media player in accordance with the described embodiments.

FIG. 6 is a block diagram of a media player 300 in accordance with the described embodiments. The media player 300 includes a processor 302 that pertains to a microprocessor or controller for controlling the overall operation of the media player 300. The media player 300 stores media data pertaining to media items in a file system 304 and a cache 306. The file system 304 is, typically, a storage disk or a plurality of disks. The file system typically provides high capacity storage capability for the media player 300. However, since the access time to the file system 304 is relatively slow, the media player 300 also includes a cache 306. The cache 306 is, for example, Random-Access Memory (RAM) provided by semiconductor memory. The relative access time to the cache 306 is substantially shorter than for the file system 304. However, the cache 306 does not have the large storage capacity of the file system 304.

Further, the file system 304, when active, consumes more power than does the cache 306. The power consumption is particularly important when the media player 300 is a portable media player that is powered by a battery (not shown).

The media player 300 also includes a user input device 308 that allows a user of the media player 300 to interact with the media player 300. For example, the user input device 308 can take a variety of forms, such as a button, keypad, dial, etc. Still further, the media player 300 includes a display 310 (screen display) that can be controlled by the processor 302 to display information to the user. A data bus 311 can facilitate data transfer between at least the file system 304, the cache 306, the processor 302, and the CODEC 312.

In one embodiment, the media player 300 serves to store a plurality of media items (e.g., songs) in the file system 304. When a user desires to have the media player play a particular media item, a list of available media items is displayed on the display 310. Then, using the user input device 308, a user can select one of the available media items. The processor 302, upon receiving a selection of a particular media item, supplies the media data (e.g., audio file) for the particular media item to a coder/decoder (CODEC) 312. The CODEC 312 then produces analog output signals for a speaker 314. The speaker 314 can be a speaker internal to the media player 400 or external to the media player 300. For example, headphones or earphones that connect to the media player 300 would be considered an external speaker.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The many features and advantages of the present invention are apparent from the written description and, thus, it is intended by the appended claims to cover all such features and advantages of the invention. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A structural frame component for an electronic device, comprising:
    a first layer formed from a first material, the first material configured to add structural stiffness to the electronic device;
    a second layer and a third layer disposed on opposing surfaces of the first layer, wherein the second and third layers are formed from materials having a thermal conductivity greater than the first layer;
    an opening fully extending through the first layer; and
    a bridge structure disposed within the opening and thermally coupled to the second and third layers, wherein the bridge structure allows heat to transfer between the second layer and the third layer.

2. The structural frame component as recited in claim 1, wherein the first layer is formed from a first metal and the second and third layers are formed from a second metal.

3. The structural frame component as recited in claim 2, wherein the first metal is steel and the second metal is copper.

4. The structural frame component as recited in claim 2, wherein the first, second and third layers are joined via a cladding process.

5. The structural frame component as recited in claim 4, wherein the bridge structure is formed by extruding portions of the second and third layers into the opening in the first layer during the cladding process.

6. The structural frame component as recited in claim 1, wherein the bridge structure comprises a layer of thermally conductive solder.

7. The structural frame component as recited in claim 1, wherein the bridge structure comprises a layer of thermally conductive tape.

8. The structural frame component as recited in claim 1, wherein the bridge structure is aligned with a heat generating component thermally coupled to the first layer.

9. A portable electronic device, comprising:
    a housing forming an external surface for the electronic device and including an opening;
    a display disposed within the opening in the housing;
    an internal frame coupled to one or more interior surfaces of the housing, the internal frame further comprising:
        a middle layer formed from a first material and having an opening extending through the middle layer, the first material configured to add structural stiffness to the electronic device, and
        a first outer layer and a second outer layer, the first and second outer layers disposed on opposing surfaces of the middle layer, wherein the first and second outer layers are formed from materials configured to conduct heat; and
    an electronic component disposed within the housing and thermally coupled to the internal frame, wherein the first and second outer layers spread and transfer heat generated by the component to the housing.

10. The portable electronic device as recited in claim 9, wherein the first and second outer layers are formed from materials having a thermal conductivity greater than the first material used to form the middle layer.

11. The portable electronic device as recited in claim 10, wherein the first and second outer layers are formed from a material having a thermal conductivity at least 10 times greater than the thermal conductivity of the first material.

12. The portable electronic device as recited in claim 10, further comprising:
    a thermally conductive filler disposed within the opening and thermally coupled to the first and second outer layers, wherein the thermally conductive filler allows heat to transfer between the first outer layer and the second outer layer.

13. The portable electronic device as recited in claim 12, wherein the thermally conductive filler is a layer of thermally conductive tape.

14. The portable electronic device as recited in claim 12, wherein the thermally conductive filler is made from thermally conductive solder.

15. The portable electronic device as recited in claim 12, wherein the electronic component is coupled to the internal frame proximate to the thermally conductive filler, the thermally conductive filler allowing the heat generated by the electronic component to transfer between the first and second outer layers.

16. The portable electronic device as recited in claim 15, wherein the electronic component is thermally coupled to the internal frame by a thermally conductive adhesive.

17. The portable electronic device as recited in claim 15, further comprising a raised thermal connector coupled to the internal frame and the electronic component, wherein the thermal connector transfers heat from the electronic component to the internal frame.

18. The portable electronic device as recited in claim 15, wherein a combined thickness of the first and second outer layers is approximately equal to a thickness of the middle layer.

19. The portable electronic device as recited in claim 18, wherein the middle layer is steel and the first and second outer layers are copper.

20. The portable electronic device as recited in claim 19, wherein the middle layer and first and second outer layers are joined using a cladding process.

* * * * *